United States Patent
Lee et al.

(10) Patent No.: US 10,269,962 B2
(45) Date of Patent: Apr. 23, 2019

(54) SEMICONDUCTOR DEVICE AND METHOD FOR MANUFACTURING THE SAME

(71) Applicant: SAMSUNG ELECTRONICS CO., LTD., Suwon-si, Gyeonggi-Do (KR)

(72) Inventors: Seung Ryul Lee, Seoul (KR); Sang Moon Lee, Suwon-si (KR); Chul Kim, Seongnam-si (KR); Ji Eon Yoon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 213 days.

(21) Appl. No.: 15/335,492

(22) Filed: Oct. 27, 2016

(65) Prior Publication Data
US 2017/0194479 A1    Jul. 6, 2017

(30) Foreign Application Priority Data
Jan. 6, 2016 (KR) .................. 10-2016-0001537

(51) Int. Cl.
*H01L 29/78*    (2006.01)
*H01L 29/423*    (2006.01)

(52) U.S. Cl.
CPC ...... *H01L 29/785* (2013.01); *H01L 29/42392* (2013.01); *H01L 29/7848* (2013.01)

(58) Field of Classification Search
CPC ........... H01L 29/42392; H01L 29/7848; H01L 29/785; H01L 29/0673; H01L 29/78696; H01L 29/775; H01L 29/66439
See application file for complete search history.

(56) References Cited

U.S. PATENT DOCUMENTS

| | | | |
|---|---|---|---|
| 7,144,765 B2 | 12/2006 | Anda et al. | |
| 8,008,215 B2 | 8/2011 | Tandon et al. | |
| 8,617,971 B2 | 12/2013 | Hekmatshoartabari et al. | |
| 8,901,533 B2 | 12/2014 | Lee et al. | |
| 8,901,656 B2 | 12/2014 | Aoki et al. | |
| 8,957,425 B2 | 2/2015 | Yamada | |
| 2013/0099283 A1 | 4/2013 | Lin et al. | |
| 2013/0196488 A1 | 8/2013 | Hekmatshoartabari et al. | |
| 2013/0270512 A1 | 10/2013 | Radosavljevic et al. | |
| 2013/0270652 A1 | 10/2013 | Liaw | |
| 2013/0309830 A1 | 11/2013 | Guo et al. | |
| 2014/0061722 A1 | 3/2014 | Doornbos et al. | |
| 2014/0103294 A1 | 4/2014 | Radosavljevic et al. | |
| 2014/0191286 A1 | 7/2014 | Adam et al. | |
| 2014/0225065 A1* | 8/2014 | Rachmady ........ H01L 29/42392 257/24 |

(Continued)

FOREIGN PATENT DOCUMENTS

| | | |
|---|---|---|
| JP | 05291156 | 11/1993 |
| JP | 2560601 | 9/1996 |
| JP | 2013-008832 | 1/2013 |

*Primary Examiner* — Joseph Galvin, III
(74) *Attorney, Agent, or Firm* — Volentine, Whitt & Francos, PLLC

(57) ABSTRACT

A semiconductor device has a fin-type structure which extends in a first direction and includes a laminate of oxide and semiconductor patterns disposed one on another on a first region of a substrate, and a first gate electrode that extends longitudinally in a second direction different from the first direction on the fin-type structure. Each oxide pattern is an oxidized compound containing a first element.

20 Claims, 26 Drawing Sheets

(56) References Cited

U.S. PATENT DOCUMENTS

| | | | |
|---|---|---|---|
| 2014/0242761 A1 | 8/2014 | Wong et al. | |
| 2014/0291726 A1* | 10/2014 | Pillarisetty | H01L 21/8258 257/190 |
| 2015/0243733 A1* | 8/2015 | Yang | H01L 29/0673 257/401 |
| 2015/0287711 A1* | 10/2015 | Kim | H01L 27/0207 257/344 |
| 2016/0204195 A1* | 7/2016 | Wen | H01L 21/02532 257/347 |
| 2017/0005195 A1* | 1/2017 | Ching | H01L 29/7848 |

* cited by examiner
SEMICONDUCTOR DEVICE AND METHOD FOR MANUFACTURING THE SAME This application claims priority from Korean Patent Application No. 10-2016-0001537 filed on Jan. 6, 2016 in the Korean Intellectual Property Office, the disclosure of which is hereby incorporated by reference in its entirety.

BACKGROUND

1. Technical Field

The present inventive concept relates to a semiconductor device and to a method for manufacturing the same. More particularly, the present inventive concept relates to a semiconductor device including a compound semiconductor and to a method for manufacturing the same.

2. Description of the Related Art

As one of scaling techniques for enhancing the density of semiconductor devices, a multi-gate transistor has been suggested in which a silicon body of a fin or nanowire structure is formed on a substrate and a gate is formed on a surface of the silicon body.

Because such a multi-gate transistor uses a 3-D channel, it is easily scaled. Furthermore, the current control capability may be improved even without increasing the gate length of the multi-gate transistor. It is also possible to effectively suppress a short channel effect (SCE) in which the potential of the channel region is influenced by the drain voltage.

Moreover, new semiconductor materials are being looked into in an attempt to improve the mobility in the channel region of the transistors.

SUMMARY

According to an example of the inventive concept, a semiconductor device comprises a substrate, a fin-type structure that includes a laminate of patterns of oxide and semiconductor material disposed one on another on a first region of the substrate, and a first gate electrode that is disposed on the fin-type structure and extends longitudinally across the fin-type structure, and in which the oxide comprises an oxidized compound including a plurality of elements and oxygen.

According to another example of the inventive concept, a semiconductor device comprises a substrate having a first region, a second region and a third region, a fin-type structure disposed on the first region of the substrate, a first gate electrode disposed on and extending longitudinally across the fin-type structure, a first wire pattern structure disposed on the second region of the substrate, a second gate electrode wrapped around the first wire pattern structure and extending longitudinally across the first wire pattern structure, a second wire pattern structure disposed on the third region of the substrate, and a third gate electrode wrapped around the second wire pattern and extending longitudinally across the second wire pattern structure, and in which the first wire pattern structure comprises an antimony (Sb) series group III-V compound semiconductor material, and the second wire pattern comprises an arsenic (As) series group III-V compound semiconductor.

According to another example of the inventive concept, a semiconductor device comprises a substrate, a raised channel-forming structure extending upright on the substrate and having an upper surface, opposite first sides and opposite second sides, a gate electrode that extends over the upper surface of the channel-forming structure and the opposite first sides of the channel-forming structure, and a source/drain region adjacent to the opposite second sides of the channel-forming structure, and in which the channel-forming structure includes a plurality of vertically spaced-apart channel-forming patterns each of a group III-V compound semiconductor.

BRIEF DESCRIPTION OF THE DRAWINGS

The above and other aspects and features of the present inventive concept will become more apparent by describing in detail examples thereof with reference to the attached drawings, in which.

DETAILED DESCRIPTION

Figure 1:
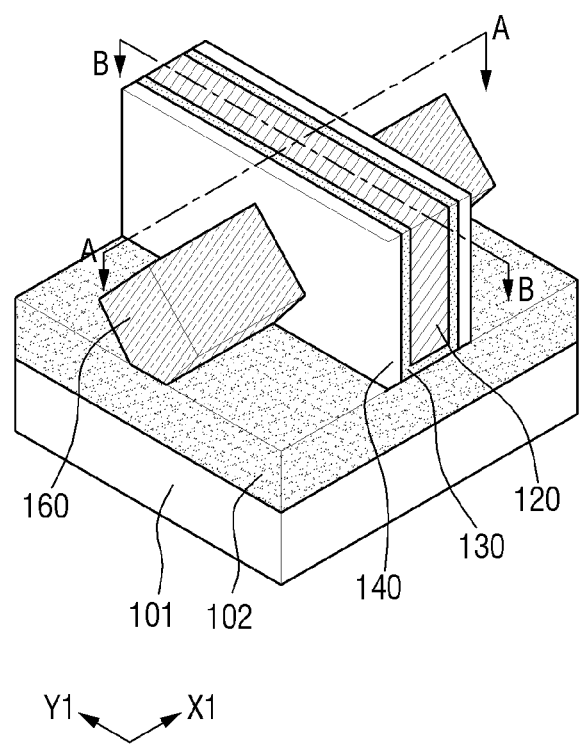
FIG. 1 is a perspective view of some examples of a semiconductor device according to the present inventive concept.

Advantages and features of the present inventive concept and methods of accomplishing the same may be understood more readily by reference to the following detailed description of preferred examples and the accompanying drawings. The present inventive concept may, however, be embodied in many different forms and should not be construed as being limited to the examples set forth herein. Rather, these examples are provided so that this disclosure will be thorough and complete and will fully convey the inventive concept to those skilled in the art, and the present inventive concept will only be defined by the appended claims. In the drawings, the thickness of layers and regions are exaggerated for clarity.

Next, some examples of a semiconductor device according to the present inventive concept will be described referring to FIGS. 1 to 3.

A semiconductor device according to the present inventive concept includes a substrate 101, a first fin-type structure 150, a first gate electrode 120, a first gate insulating film 130, first gate spacers 140 and a first source/drain 160. Furthermore, a buffer layer 102 may be disposed on the substrate 101, and the first fin-type structure 150 may include an oxide pattern 151a and a semiconductor pattern 152.

The substrate 101, for example, may be bulk silicon or silicon-on-insulator (SOI). Alternatively, the substrate 101 may be a substrate of other materials, e.g., silicon germanium, indium antimonide, lead telluride, indium arsenide, indium phosphide, gallium arsenide or gallium antimonide. Alternatively, the substrate 101 may be one in which an epitaxial layer is formed on a base. In the examples described in the following, the substrate 101 is a silicon substrate. However, as is clear from the above the present inventive concept is not limited thereto.

The buffer layer 102 may be formed on the substrate 101. The buffer layer 102 is disposed between the substrate 101 and the fin-type structure and 150 to reduce a difference in lattice constants between the substrate 101 and the fin-type structure 150. That is, defects caused by a difference in lattice constants between the substrate 101 and the fin-type structure 150 may be reduced through the buffer layer 102.

Accordingly, the buffer layer 102 may be formed of a material having a lattice constant between the lattice constant of the substrate 101 and the lattice constant of the material used to form the oxide pattern 151a, i.e., the material before being oxidized. The buffer layer 102 may contain group III-V compound semiconductor materials. For example, the buffer layer 102 may contain at least one of GaAs, GaP, InAs and InP. The buffer layer 102 may be a multi-layered structure, and in this case, the lattice constant of the buffer layer 102 may intermittently or continuously vary so that a layer closer to the substrate 101 has a lattice constant similar to the substrate 101, and a lattice constant of a layer close to the fin-type structure 150 has a lattice constant similar to the lattice constant of the material oxidized to form the oxide pattern 151a. More specifically, the lattice constant of the buffer layer 102 may increase as it gets close to the fin-type structure 150 from the substrate 101.

For example, when the substrate 101 is a silicon substrate, the lattice constant is approximately 5.43 Å, and when the oxide pattern 151a prior to being oxidized contains an InSb material of the group III-V compound semiconductor materials, the lattice constant may be approximately 5.9 Å. In this case, the buffer layer 102 may contain a material having a lattice constant between silicon and the InSb material. For example, the buffer layer 102 may contain a GaAs material having a lattice constant of 5.65 Å.

Furthermore, in this case, when the lattice constants of the buffer layer 102 varies, the lattice constant in the buffer layer 102 may be continuously or intermittently varied by adjusting the content of Ga and the content of As in $Ga_xAs_y$ (where, x+y=1).

However, this description is an example, and the present inventive concept is not limited thereto. Accordingly, even when the buffer layer 102 contains other compound semiconductors, the technical sprit related to the above-described lattice constant may be equally applied.

The fin-type structure 150 is formed on the substrate 101. The fin-type structure 150 is formed to extend in a first direction X1. The fin-type structure 150 has a structure in which the oxide pattern 151a and the semiconductor pattern 152 are laminated to intersect with each other, and the fin-type structure 150 is formed on the buffer layer 102. In examples of the inventive concept, the fin-type structure 150 includes, i.e., has but is not limited to, three oxide patterns 151a and two semiconductor patterns 152. The fin-type structure may comprise a raised channel-forming structure owing to the provision of the semiconductor pattern(s) 152.

The oxide pattern 151a of the fin-type structure 150 may contact the buffer layer 102 or the substrate 101. The oxide pattern 151a may be an oxide in which the group III-V compound semiconductor material is oxidized. The oxide pattern 151a may be an oxide which the group III-V compound semiconductor material including a first element is oxidized. In the present example, the first element may be Al. The oxide pattern 151a may be an amorphous material.

The aforementioned group III-V compound semiconductor, for example, may be a binary compound, a ternary compound or a quaternary compound formed of at least one of aluminum (Al), gallium (Ga) and indium (In) as a group III element with one of phosphorous (P), arsenic (As) and antimony (Sb) as a group V element.

For example, the group III-V compound semiconductors include, but are not limited to, AlAs, InAlAs, AlP, InAlP and AlSb.

In the present inventive concept, the oxide pattern 151a contains a first element having a relatively greater oxidation power as compared to the elements of the semiconductor pattern 152. That is, the first element of the oxide pattern 151a is oxidized more readily than the elements of the semiconductor pattern 152 under a given oxidation process (treatment). For example, aluminum has a relatively high oxidation power, as compared to other group III-V elements. In this case, the compound semiconductors containing aluminum may be more rapidly oxidized in the oxidation process, as compared to other compound semiconductors. A more detailed description thereof will be provided in connection with the descriptions of the examples of the manufacturing method according to the inventive concept.

Meanwhile, the oxide pattern 151a prior to oxidation may perform the role of the above-mentioned buffer layer 102. In this case, the buffer layer 102 may be excluded, and the oxide pattern 151a prior to oxidation may be directly formed on the substrate 101. In this case, the description of the lattice constant of the buffer layer 101 may be similarly applied to the oxide pattern 151a prior to oxidation, and specifically, the oxide pattern 151a prior to oxidation may contain a material having a lattice constant between the lattice constant of the substrate 101 and the lattice constant of the semiconductor pattern 152.

The semiconductor pattern 152 of the fin-type structure 150 is disposed on the oxide pattern 151a to perform the role of a channel of the semiconductor device in these examples according to the inventive concept.

The semiconductor pattern 152 may contain one of the group III-V compound semiconductors. As an example, the group III-V compound semiconductors may be one of a binary compound, a ternary compound or a quaternary compound formed by combination of at least one of aluminum (Al), gallium (Ga) and indium (In) as a group III element with one of phosphorous (P), arsenic (As) and antimony (Sb) as a group V element. For example, the semiconductor pattern 152 may consist of or contain InGaAs, InAs, GaSb or InSb.

Figure 3:
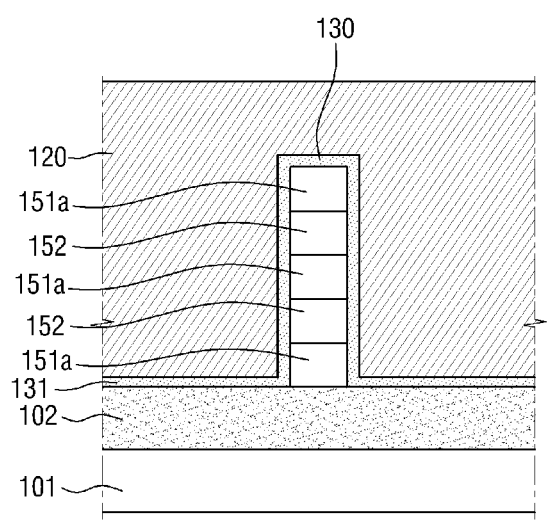
FIG. 3 is a cross-sectional view taken along line B-B of FIG. 1.

In FIG. 3, although the cross sections of the oxide pattern 151a and the semiconductor pattern 152 of the fin-type structure 150 are illustrated as rectangular, the cross-sectional shapes are not limited thereto. It is a matter of course that the corners of the oxide pattern 151a and the semiconductor pattern 152 may be rounded through a trimming process.

The first gate electrode 120 is formed on the buffer layer 102. The first gate electrode 120 is formed to extend longitudinally across the fin-type structure 150 in the second direction Y1. The first gate electrode 120 is formed on the upper surface and opposite side surfaces of the fin-type structure 150 and is formed to be spaced apart from the substrate 101. Thus, the first gate electrode 120 may cover first opposite sides of the raised channel-forming structure.

The first gate electrode 120 may contain a conductive material. Although the first gate electrode 120 is illustrated as a single layer, this is only for the convenience of illustration, and the inventive concept is not limited thereto. That is, the first gate electrode 120 may include a work function conductive layer that adjusts the work function, and a filling conductive layer that fills a space formed by the work function conductive layer for the work function adjustment.

The first gate electrode 120, for example, may contain at least one of TiN, WN, TaN, Ru, TiC, TaC, Ti, Ag, Al, TiAl, TiAlN, TiAlC, TaCN, TaSiN, Mn, Zr, W and Al. Alternatively, each of the first gate electrodes 120 may also be made of a semiconductor material other than a metal. Each of the first gate electrodes 120 may be formed through a gate replacement process, but the inventive concept is not limited thereto.

The first gate spacers 140 are formed on both side surfaces of the first gate electrode 120 as extending therealong in the second direction Y1. The first gate spacers 140 are formed at both sides of the fin-type structure 150 to face each other.

The first gate spacers 140 may contain, for example, at least one of silicon nitride (SiN), silicon oxynitride (SiON), silicon oxide ($SiO_2$), and silicon nitride shot (SiOCN). Although each of the first gate spacers 140 is illustrated as a single film, it is not limited thereto, i.e., each first gate spacers 140 may have multiple films.

The first gate insulating film 130 may be interposed between the fin-type structure 150 and the first gate electrode 120. The first gate insulating film 130 may be interposed between the first gate electrode 120 and the first gate spacers 140. Furthermore, the first gate insulating film 130 may be interposed between the substrate 101 and the first gate electrode 120.

The first gate insulating film 130 may be conformally formed along the upper surface and the side surfaces of the fin-type structure 150 and the side surfaces of the first gate electrode 120. The first gate insulating film 130 may be formed along the upper surface of the buffer layer 10.

The first gate insulating film 130 has opposite sidewalls interposed between the side surfaces of the first gate electrode 120 and the side surfaces of the first gate spacers 140, respectively. That is, one sidewall of the first gate insulating film 130 extends along one side of the first gate electrode 120, and the other sidewall of the first gate insulating film 130 extends along the other side of the first gate spacers 140.

The first gate insulating film 130 may contain a high-k dielectric material, i.e., dielectric material having a dielectric constant higher than that of a silicon oxide film. For example, the first gate insulating film 130 (and the second gate insulating film 230 shown in an described later with reference to FIG. 25) may contain at least one high-k dielectric material selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

The first source/drain 160 is disposed on both sides of the first gate electrode 120 adjacent to opposite (second) sides of the raised channel-forming structure. The first source/drain 160 is formed on the substrate 101 or the buffer layer 102 and is connected to the fin-type structure 150.

An epitaxial seed layer for epitaxial growth may be used to form the first source/drain 160 and the buffer layer 102, but the inventive concept is not limited thereto.

The profiles (or cross sections) of the first source/drain 160 may have various shapes. For example, the cross section or profile of each the first source/drain 160 may be generally diamond-shaped (including pentagonal or hexagonal), circular or rectangular. That is, although the FIG. 1 illustrates generally diamond-shaped source/drains 160 (pentagonal) as an example, the inventive concept is not limited thereto.

Moreover, the first source/drain 160 may contain a material capable of applying a compressive stress to the fin-type structure 150 used as a channel region of PMOS. To this end, the first source/drain 160 may contain a material having a lattice constant greater than that of the fin-type structure 150.

Alternatively, the first source/drain 160 may contain a material capable of applying a tensile stress to the fin-type structure 150 used as the channel region of NMOS. To this end, the first source/drain 160 may contain a material having a lattice constant smaller than that of the fin-type structure 150.

Figure 2:
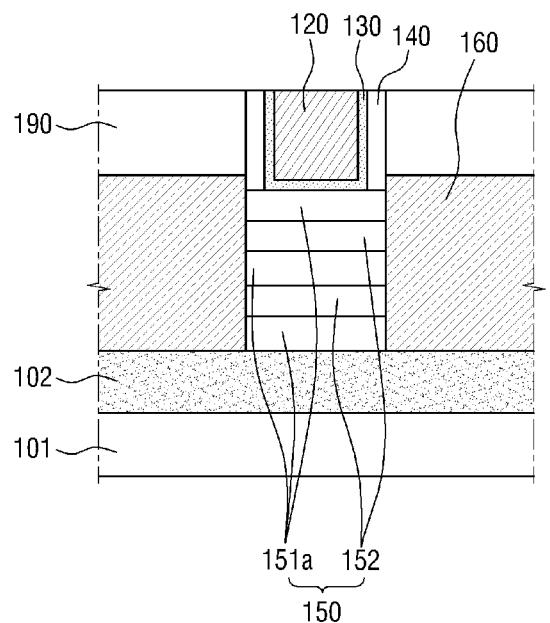
FIG. 2 is a cross-sectional view taken along line A-A of FIG. 1.

In FIGS. 1 to 3, the first gate insulating film 130 may be generally formed along the side surfaces of the first gate electrode 120.

In the present examples, the semiconductor pattern 152 of the fin-type structure 150 may include a group III-V compound semiconductor, thereby improving the mobility of the channel of the semiconductor device.

Next, some examples of a method of manufacturing a semiconductor device according to the present inventive concept will be described with reference to FIGS. 4 through 13.

The method may be used to manufacture the semiconductor device described with reference to FIGS. 1 through 3. Accordingly, the same reference numerals refer to the same elements.

Figure 4:
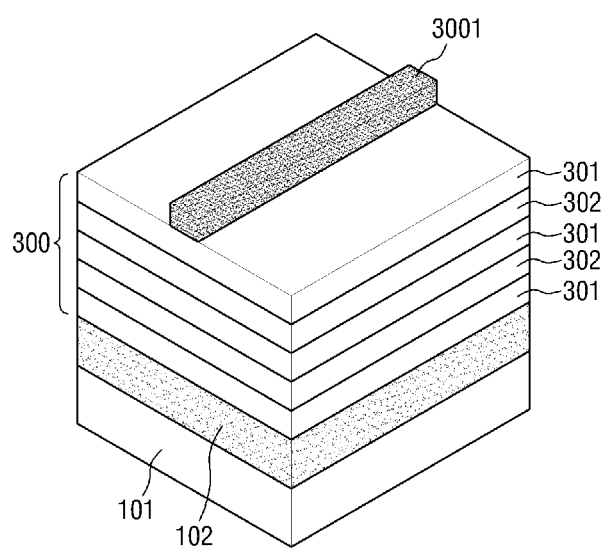
FIGS. 4 through 13 illustrate some examples of a method of manufacturing a semiconductor device according to the present inventive concept with FIGS. 4, 5, 6, 7, 8 and 9 each being a perspective view of the device during the course of its manufacture, FIGS. 10 and 12 being sectional views of the device during the course of its manufacture taken in the direction of line A-A of FIG. 9, and FIGS. 11 and 13 being sectional views of the device during the course of its manufacture taken in the direction of line B-B of FIG. 9.

Referring to FIG. 4, the buffer layer 102 is formed on the substrate 101, and a laminated structure or simply "laminate" 300 is formed on the buffer layer 102 by alternately forming the first compound semiconductor layer 301 and the second compound semiconductor layer 302.

As described with reference to FIGS. 1 through 3, the buffer layer 102 may contain a compound semiconductor material. Furthermore, the buffer layer 102 may contain a material having a lattice constant having a magnitude between the lattice constant of the substrate 101 and the lattice constant of the first compound semiconductor layer 301 or the second compound semiconductor layer 302. In the present examples, the buffer layer 102 contains a material having a lattice constant between the lattice constant of the substrate 101 and the lattice constant of the first compound semiconductor layer 301.

Furthermore, the forming of the buffer layer 102 may be omitted. In this case, the first compound semiconductor layer 301 may be directly formed on the substrate 101, and may contain a material having a lattice constant between the lattice constant of the substrate 101 and the lattice constant of the second compound semiconductor layer 302.

However, methods will be described in the following with respect to examples in which the buffer layer 102 is formed, although the present inventive concept is not limited thereto.

The second compound semiconductor layer 302 and the first compound semiconductor layer 301 may be alternately formed on the first compound semiconductor layer 301 that is in contact with the buffer layer 102. The first compound semiconductor layer 301 and the second compound semiconductor layer 302 may be formed, for example, using an epitaxial growth method. An uppermost layer of the laminated structure 300 may be the first compound semiconductor layer 301, for example.

The first compound semiconductor layer 301 and the second compound semiconductor layer 302 contain materials different from each other. The first compound semiconductor layer 301 and the second compound semiconductor layer 302 may contain a group III-V compound semiconductor material, and the group III-V compound semiconductor may be one of a binary compound, a ternary compound or a quaternary compound formed by combination of at least one of aluminum (Al), gallium (Ga) and indium (In) as a group III element with one of phosphorous (P), arsenic (As) and antimony (Sb) as a group V element.

The first compound semiconductor layer 301 may contain a group III-V compound semiconductor material including aluminum, such as AlAs, InAlAs, AlP, InAlP or AlSb.

Next, a first mask pattern 3001 extending in the first direction X1 is formed on the laminated structure 300. The first mask pattern 3001 may be formed of at least one of a silicon oxide film, a silicon nitride film and a silicon oxynitride film, for example.

Figure 5:
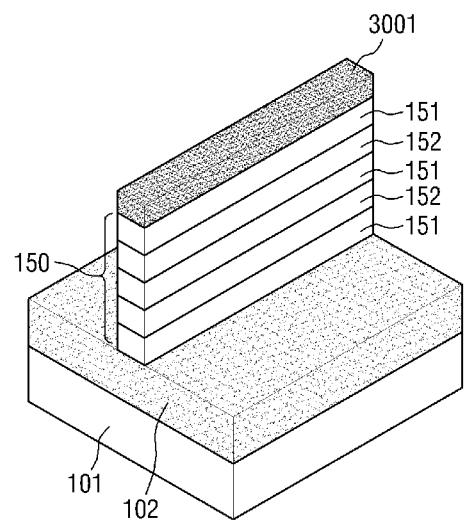

Referring to FIG. 5, the laminated structure 300 is etched using the first mask pattern 3001 as a mask to form the first fin-type structure 150. For example, by etching the laminated structure 300 until the upper surface of a buffer layer 102 is exposed, the first fin-type structure 150 may be formed.

The first fin-type structure 150 may extend longitudinally in the first direction. The first fin-type structure 150 may include a preliminary semiconductor pattern 151 and a semiconductor pattern 152 that are alternately stacked on the buffer layer 102. Next, the first mask pattern 3001 located on the first fin-type structure 150 may be removed.

Figure 6:
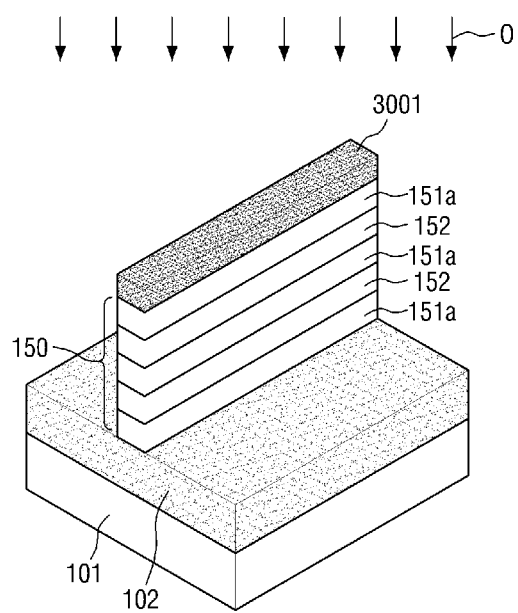

Referring to FIG. 6, a selective oxidation process O is performed. By performing the selective oxidation process O, the preliminary semiconductor pattern 151 may be formed as the oxide pattern 151a.

In the present example, the preliminary semiconductor pattern 151 includes a compound semiconductor material containing aluminum. Aluminum may be relatively fully oxidized most easily among the group III and group V elements. Therefore, the group III-V compound semiconductor materials including aluminum may be relatively fully oxidized, as compared to other types of group III-V compound semiconductor materials. That is, in the selective oxidation process O, the preliminary semiconductor pattern 151 may be relatively rapidly oxidized as compared to the semiconductor pattern 152 that does not contain aluminum.

Thus, the preliminary semiconductor pattern 151 may be oxidized to form the oxide pattern 151a while the semiconductor pattern 152 remains non-oxidized. Here, the expression "non-oxidized" does not mean that there is no oxidation, rather oxidation to such an insignificant extent that it does not affect or only slightly impacts the role of the semiconductor pattern 152 in providing the channel of the transistor. Of course, the expression "non-oxidized" may also describe that the semiconductor pattern 152 is not oxidized at all, depending on the process conditions.

The selective oxidation process O may include, but is not limited to including, an oxygen-implanting process and/or a heating process.

Figure 7:
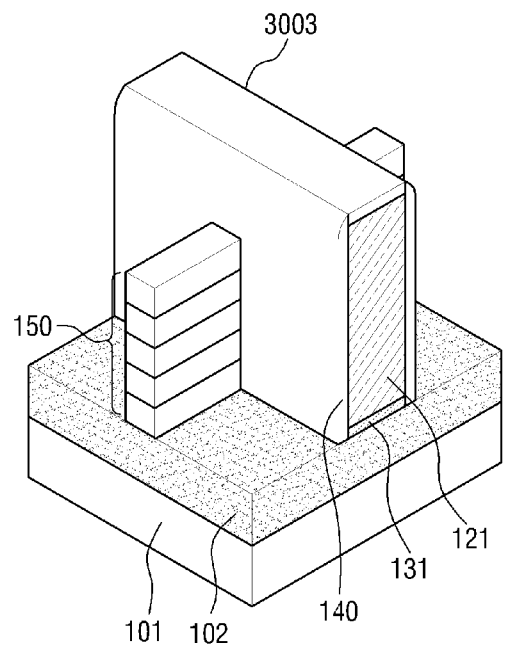

Referring to FIG. 7, by performing the etching process using the third mask pattern 3003, it is possible to form a first dummy gate insulating film 131 and a first dummy gate electrode 121 extending in a second direction Y1 to intersect with the first fin-type structure 150. Accordingly, the first dummy gate electrode 121 may be formed on the first fin-type structure 150.

The first dummy gate insulating film 131 may be a silicon oxide film, and the first dummy gate electrode 121 may be, but is not limited to, either polysilicon or amorphous silicon.

Next, first gate spacers 140 are formed on the side surfaces of the first dummy gate electrode 121. Specifically, a spacer film covering the first dummy gate electrode 121 and the first fin-type structure 150 is formed on the buffer layer 102. Subsequently, the spacers film may be etched-back to form the first gate spacers 140 on the side surfaces of the first dummy gate electrode 121.

Figure 8:
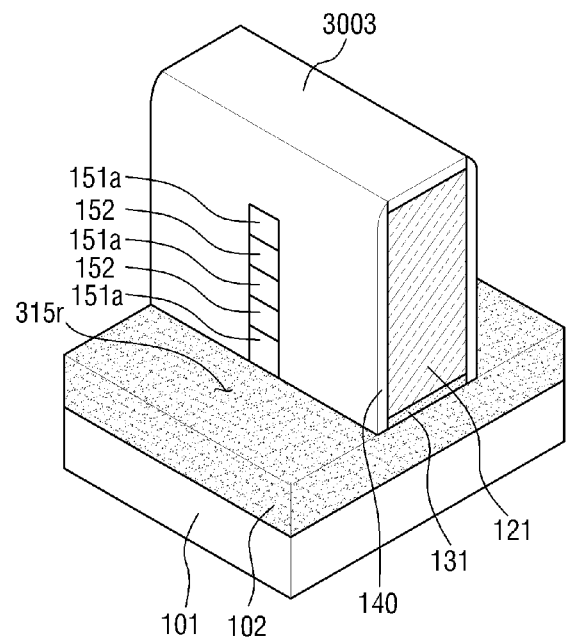

Referring to FIG. 8, by removing the first fin-type structures 150 exposed on both sides of the first dummy gate electrode 121, a first recess 315r is formed within the first fin-type structure 150.

The oxide pattern 151a and the semiconductor pattern 152 alternately stacked on the buffer layer 102 are exposed through the first recess 315r.

Figure 9:
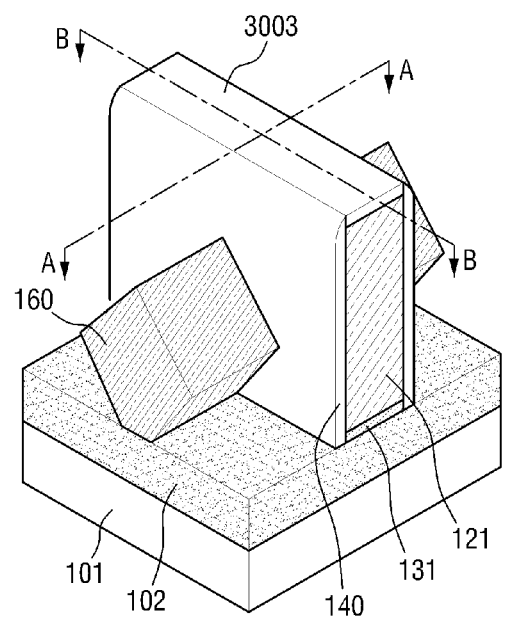
Figure 10:
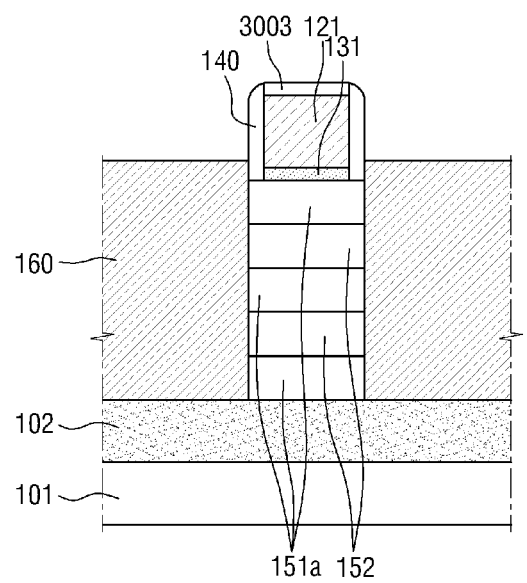
Figure 11:
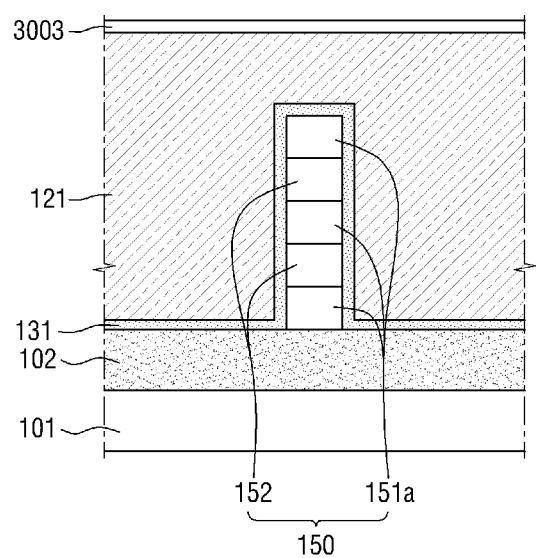

Referring to FIGS. 9 to 11, first source/drain 160 which fill the first recess 315r are formed on both sides of the first dummy gate electrode 121. The first source/drain 160 may be formed using an epitaxial growth method. To this end, an epitaxial seed layer for epitaxial growth may be formed on the buffer layer 102 and used to grow the first source/drain 160. However, the inventive concept is not limited thereto.

As shown in FIGS. 10 and 11, the first source/drain 160 is in contact with the oxide pattern 151a and the semiconductor pattern 152 located below the first dummy gate electrode 121 and sections of the first gate spacers 140.

Figure 12:
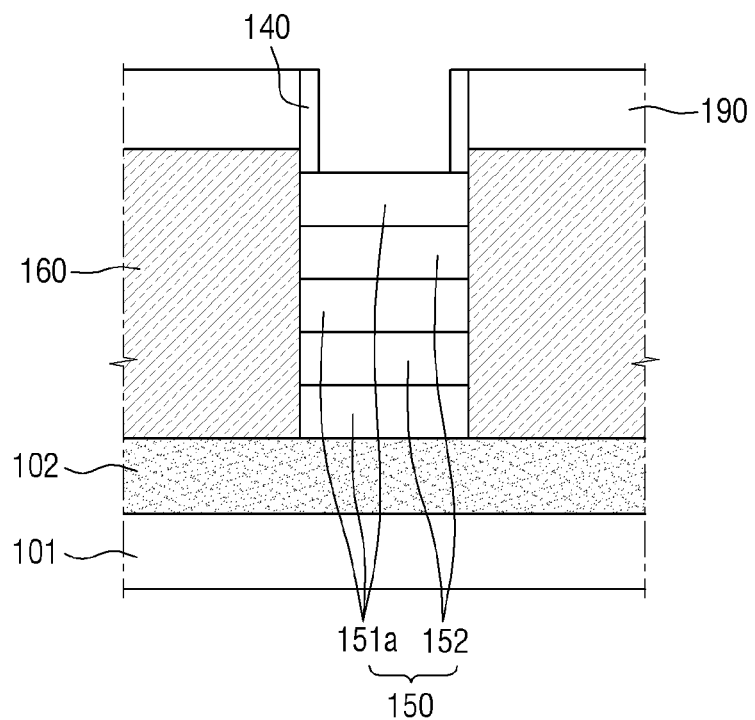
Figure 13:
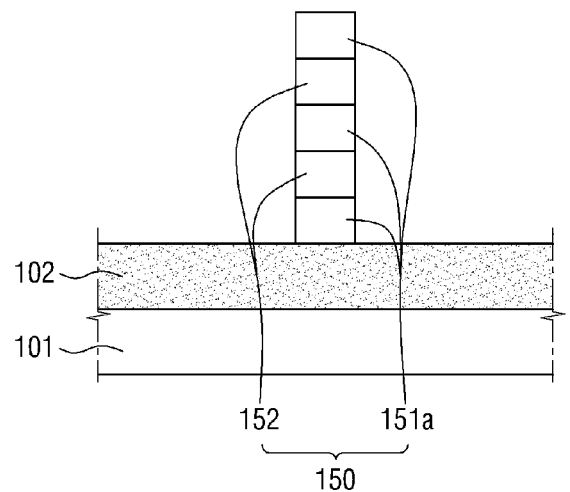

Referring to FIGS. 12 and 13, an interlayer insulating film 190 which cover the first source/drain 160, the first dummy gate electrode 121 and the first gate spacers 140 is formed on the buffer layer 102. Note, for simplicity, the interlayer insulating film 190 was not illustrated in FIG. 1.

The interlayer insulating film 190 may include at least one of a low dielectric constant material, an oxide film, a nitride film and an oxynitride film. The low dielectric constant material, for example, may be at least one of flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), and flowable CVD (FCVD) oxide.

Next, the interlayer insulating film 190 is planarized until the first dummy gate electrode 121 is exposed. As a result, the third mask pattern 3003 is removed, and the upper surface of the first dummy gate electrode 121 is exposed.

Next, the first dummy gate electrode 121 and the first dummy gate insulating film 131 are sequentially removed. Next, the first gate insulating film 130 is formed along the upper surface and the side surfaces of the exposed fin-type structure 150. Next, the first gate electrode 120 wrapping around the upper surface and the side surfaces of the fin-type structure 150 is formed on the first gate insulating film 130.

Thus, it possible to form a semiconductor device such as a semiconductor device illustrated in FIGS. 1 through 3.

In the present examples, because the preliminary semiconductor pattern 151 contains a group III-V compound semiconductor material including aluminum, it is possible to perform the selective oxidation, i.e. without substantially oxidizing the semiconductor pattern 152 containing the group III-V compound semiconductor material that does not include aluminum. Thus, the semiconductor pattern 152 may perform the role of a channel of the semiconductor device manufactured according to the present examples.

Next, the semiconductor device according to some examples of the present Inventive concept will be described with reference to FIGS. 14 through 16.

Figure 14:
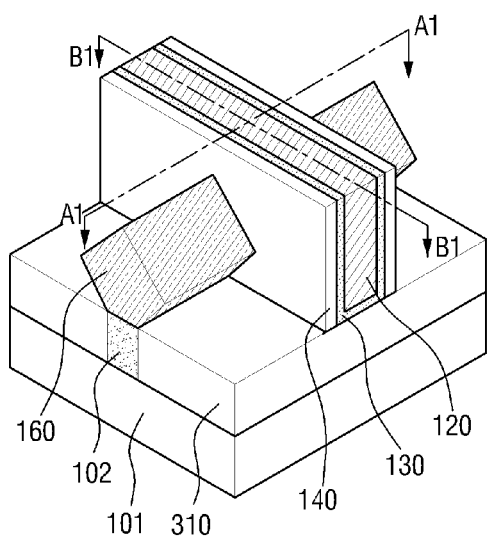
FIG. 14 is a perspective view of some examples of a semiconductor device according to the present inventive concept.
Figure 15:
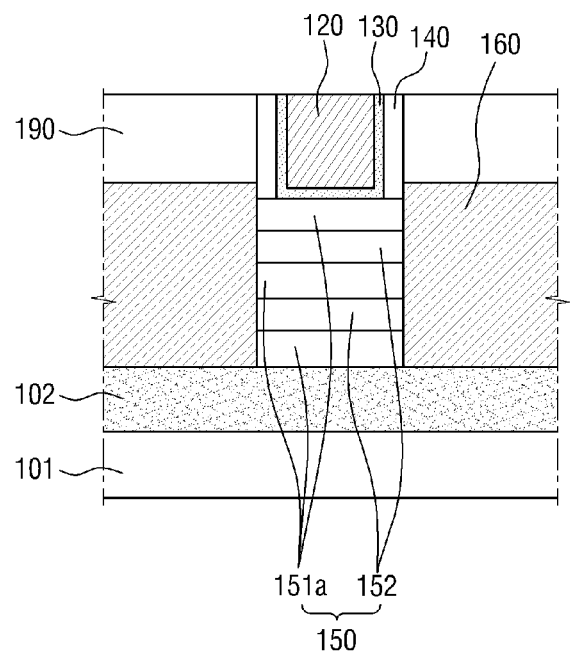
FIG. 15 is a cross-sectional view taken along line A1-A1 of FIG. 14.
Figure 16:
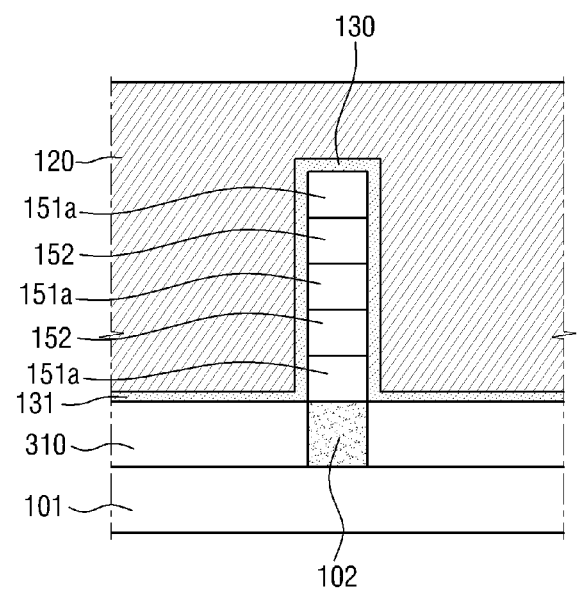
FIG. 16 is a cross-sectional view taken along line B1-B1 of FIG. 14.

FIGS. 14-16 together show other examples of a semiconductor device according to the present Inventive concept.

A semiconductor device according to these examples is substantially the same as the semiconductor device described with reference to FIGS. 1 through 3, except for the buffer layer. Thus, the same reference numerals refer to the same constituent elements, and detailed descriptions of the constituent elements may be omitted.

Referring to FIGS. 14 through 16, the buffer layer 102 may be disposed only in a region in which the substrate 101 overlaps the first fin-type structure 150 and bottoms of the first source/drain 160. An insulating layer 310 may be formed in a region in which the substrate 101 does not overlap the first fin-type structure 150 and the bottoms of the first source/drain 160.

Next, another example of a method of manufacturing a semiconductor device according to the present inventive concept will be described referring to FIGS. 17 through 19.

The present example of the method of manufacturing a semiconductor device according to the inventive concept is substantially the same as the method described with reference to FIG. 4 through FIG. 13, except for the forming of the buffer layer. Accordingly, the detailed descriptions of the same steps as performed in the method of FIGS. 4-13 may be omitted. The method may be used to manufacture a semiconductor device of the type described with reference to FIGS. 14 through 16.

Figure 17:
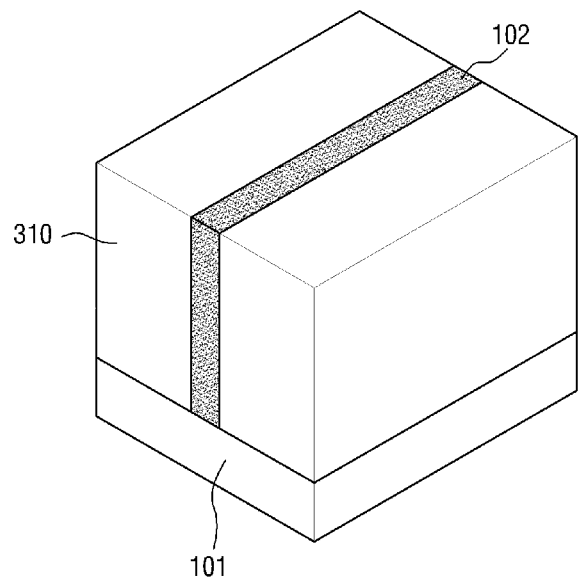
FIGS. 17, 18 and 19 are perspective views of a semiconductor device during the course of its manufacture and together illustrate some examples of a method of manufacturing the device according to the present inventive concept.

Referring to FIG. 17, an insulating film 310 is formed on the substrate 101, and after forming a recess by removing part of the insulating film 310 so that the upper surface of the substrate 101 is exposed, a buffer layer 102 is formed in the recess.

The insulating film 310 may include at least one of a low dielectric constant material, an oxide film, a nitride film and an oxynitride film. The low dielectric constant material may be at least one of flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), and flowable CVD (FCVD) oxide.

Figure 18:
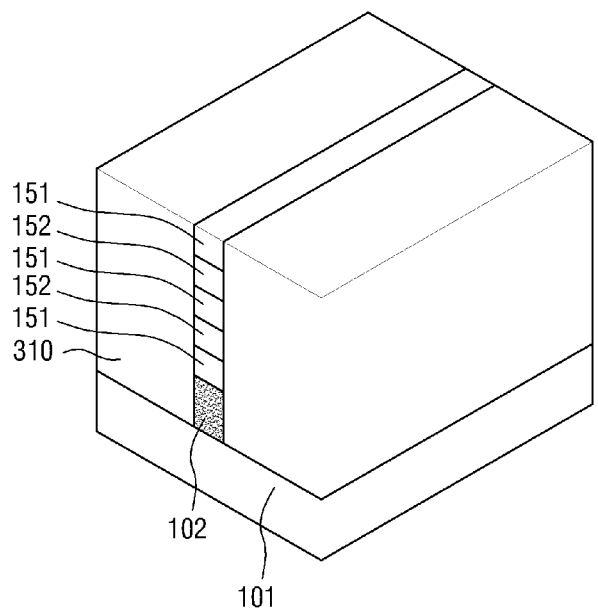

Next, referring to FIG. 18, after forming a recess by removing a part of the buffer layer 102, the preliminary semiconductor pattern 151 and the semiconductor pattern 152 are sequentially and alternately formed in the recess to form the fin-type structure 150.

Figure 19:
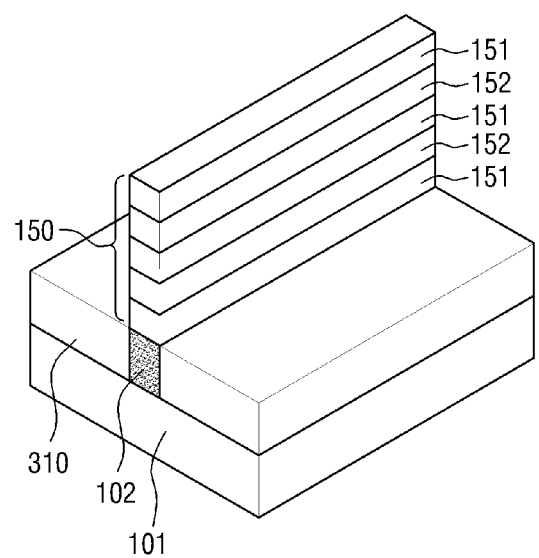

Next, referring to FIG. 19, the insulating film 310 is partially removed to expose the fin-type structure 150. After exposing the fin-type structure 150, a semiconductor device of FIGS. 14 through 16 may be formed through the intermediate processes of FIGS. 6 through 13.

Next, a semiconductor device according to some other examples of the present inventive concept will be illustrated with reference to FIGS. 20 through 22.

These examples of a semiconductor device according to the present inventive concept are substantially the same as those described with reference to FIGS. 1 through 4, except that the former includes a wire pattern instead of the fin-type structure. Accordingly, the same reference numerals refer to like elements, and a detailed description of the like elements may be omitted.

Figure 20:
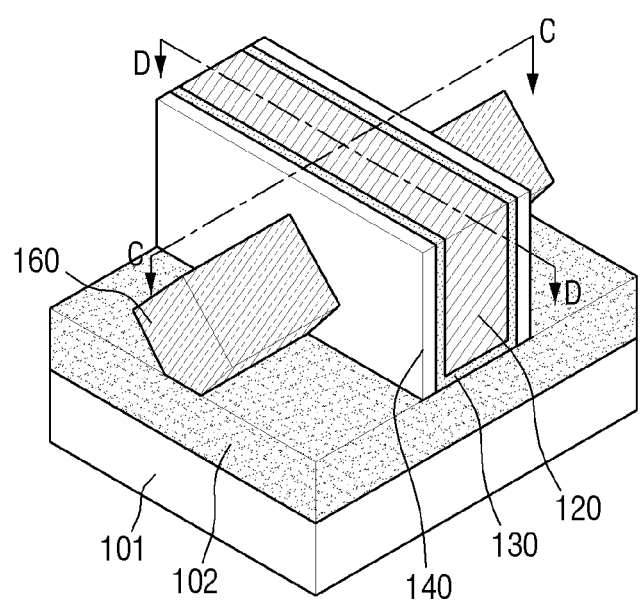
FIG. 20 is a perspective view of some examples of a semiconductor device according to the present inventive concept.
Figure 21:
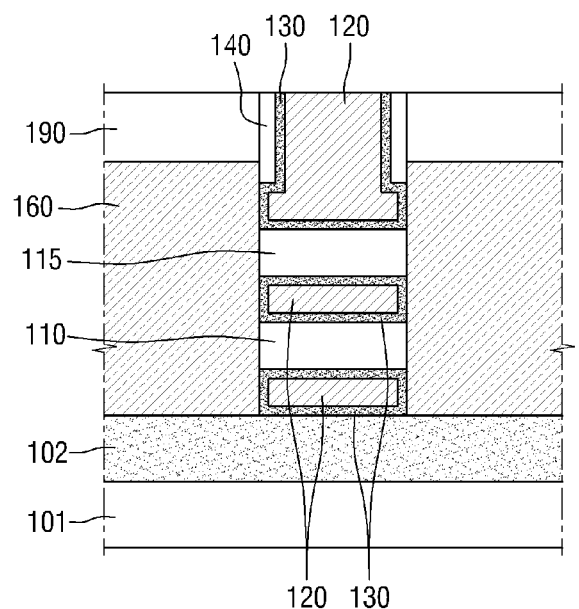
FIG. 21 is a cross-sectional view taken along line C-C of FIG. 20.
Figure 22:
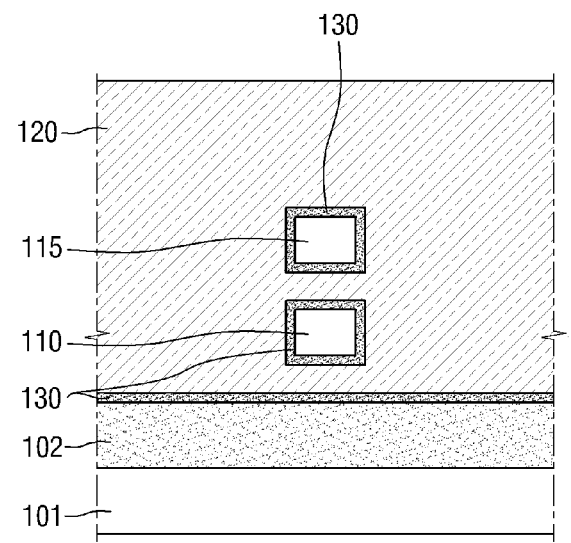
FIG. 22 is a cross-sectional view taken along line D-D of FIG. 20.

Referring to FIGS. 20 through 22, a semiconductor device according to the present inventive concept includes a substrate 101, a first wire pattern 110, a third wire pattern 115, a first gate electrode 120, a first gate insulating film 130, a first gate spacers 140 and a first source/drain 160. Furthermore, the semiconductor device may also include a buffer layer 102 on the substrate 101.

The first wire pattern 110 and the third wire pattern 115 are formed on the buffer layer 102. The first wire pattern 110 and the third wire pattern 115 are formed to extend in a first direction X2. The first wire pattern 110 is formed on the buffer layer 102 to be spaced apart from the buffer layer 102.

The first wire pattern 110 and the third wire pattern 115 may be collectively referred to as a wire pattern structure. Furthermore, although the semiconductor device has been illustrated and described as including two wire patterns, i.e., a first wire pattern 110 and a third wire pattern 115, the present inventive concept is not limited thereto, and examples of the inventive concept may have a different number wire patterns.

Each of the first wire pattern 110 and the third wire pattern 115 may include substantially the same semiconductor material as the semiconductor pattern 152 as described through FIGS. 1 through 3. That is, each of the first wire pattern 110 and the third wire pattern 115 may include a group III-V compound semiconductors, e.g., one of a binary compound, a ternary compound or a quaternary compound formed by combination of at least one of aluminum (Al), gallium (Ga) and indium (In) as a group III element with one of phosphorous (P), arsenic (As) and antimony (Sb) as a group V element. For example, each of the first wire pattern 110 and the third wire pattern 115 may contain InGaAs, InAs, GaSb or InSb. Thus, the wire pattern structure may be a raised channel-forming structure.

In FIG. 22, the respective cross sections of the first wire pattern 110 and the third wire pattern 115 are illustrated as rectangular, but the inventive concept is not limited thereto. It is a matter of course that the corners of the first wire pattern 110 and the third wire pattern 115 may be rounded through a trimming process or the like.

The first gate electrode 120 is formed on the buffer layer 102. The first gate electrode 120 is formed to extend long in a second direction Y2. The first gate electrode 120 is formed to generally wrap the first wire pattern 110 and the third wire pattern 115. The first gate insulating film 130 may be interposed between the first gate electrode 120 and the first gate spacers 140. Furthermore, the first gate insulating film 130 may be interposed between the buffer layer 102 and the first gate electrode 120.

The first gate insulating film 130 may be conformally formed along the periphery of the first wire pattern 110, the periphery of the third wire pattern 115, and the side surfaces of the first gate electrode 120. Alternatively, the first gate insulating film 130 may be conformally formed along the periphery of the first wire pattern 110, the periphery of the third wire pattern 115, and the side surfaces of the first gate spacers 140. The first gate insulating film 130 may be formed along the upper surface of the buffer layer 102. Additionally, the first gate insulating film 130 may be formed along portions of the surfaces of the first source/drain 160.

The first gate insulating film 130 is interposed between the side surfaces of the first gate electrode 120 and the side surfaces of the first gate spacers 140. Thus, one side surface of the first gate insulating film 130 extend along the side surfaces of the first gate electrode 120, and the other side surface of the first gate insulating film 130 extends along side surfaces of the first gate spacers s140.

The first source/drain 160 is disposed on both sides of the first gate electrode 120. The first source/drain 160 is formed on the buffer layer 102 and is connected to the first wire pattern 110 and the third wire pattern 115 that are a channel region.

Moreover, although the first gate insulating film 130 is interposed between the first gate electrode 120 and the first gate spacers 140, some of the first gate insulating film 130 may be in contact with the first source/drain 160, rather than being in contact with the first gate spacers 140. That is, one part of the first gate insulating film 130 contacts the first source/drain 160, and another part contacts the first gate spacers 140.

In the present examples, the first wire pattern 110 and the third wire pattern 115 may include a compound semiconductor material. Accordingly, the mobility of the channel region of the semiconductor device may be improved.

Next, a method of manufacturing a semiconductor device according to the present inventive concept will be described referring to FIGS. 23 and 24. The method may be used to manufacture a semiconductor device of the type described with reference to FIGS. 20 through 22.

In this respect, the present example is similar to that shown in and described with reference to FIGS. 4-13 and FIGS. 23 and 24 show stages subsequent to those shown FIG. 12 and FIG. 13, and thus a description of the stages of FIGS. 4-13 will be omitted.

Figure 23:
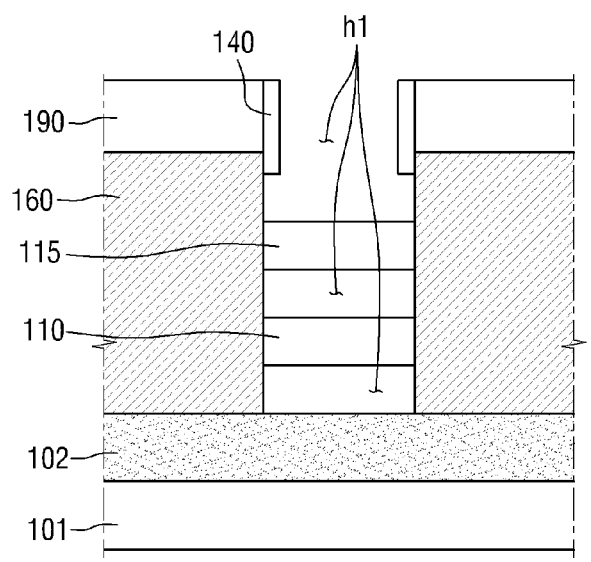
FIGS. 23 and 24 are cross-sectional views of a semiconductor device during the course of its manufacture and together illustrate some examples of a method of manufacturing the device according to some examples of the present inventive concept.
Figure 24:
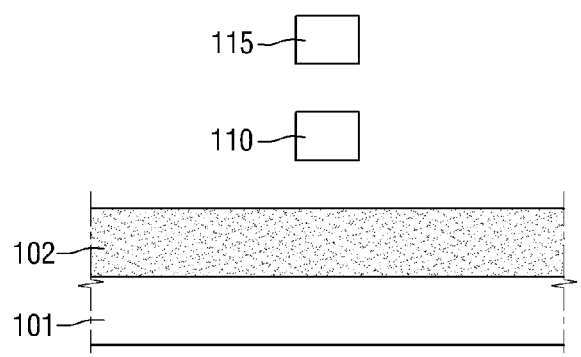

Referring to FIGS. 23 and 24, the oxide pattern 151a of FIGS. 12 and 13 is removed to form the first wire pattern 110 and the third wire pattern 115.

The oxide pattern 151a may be removed, using an etchant having an etching rate of the oxide pattern 151a higher than the etching rate of the semiconductor pattern 152.

With respect to the group III-V compound semiconductors, an etchant may etch a group III-V compound semiconductor containing aluminum that is oxidized at a higher rate than the same group III-V compound semiconductor that is not oxidized, thereby making it possible to form the first wire pattern 110 and the third wire pattern 115 according to the present inventive concept.

Next, the first gate insulating film 130 and the first gate electrode 120 are formed as illustrated in FIGS. 20 through 22.

Next, some other examples of a semiconductor device according to the present inventive concept will be described with reference to FIGS. 25 to 27.

The semiconductor device is substantially the same as the semiconductor device described with reference to FIGS. 20 through 22, except that it includes two of the transistors disposed in different regions and the wire patterns of one of the transistors includes material different from that of the other.

Figure 25:
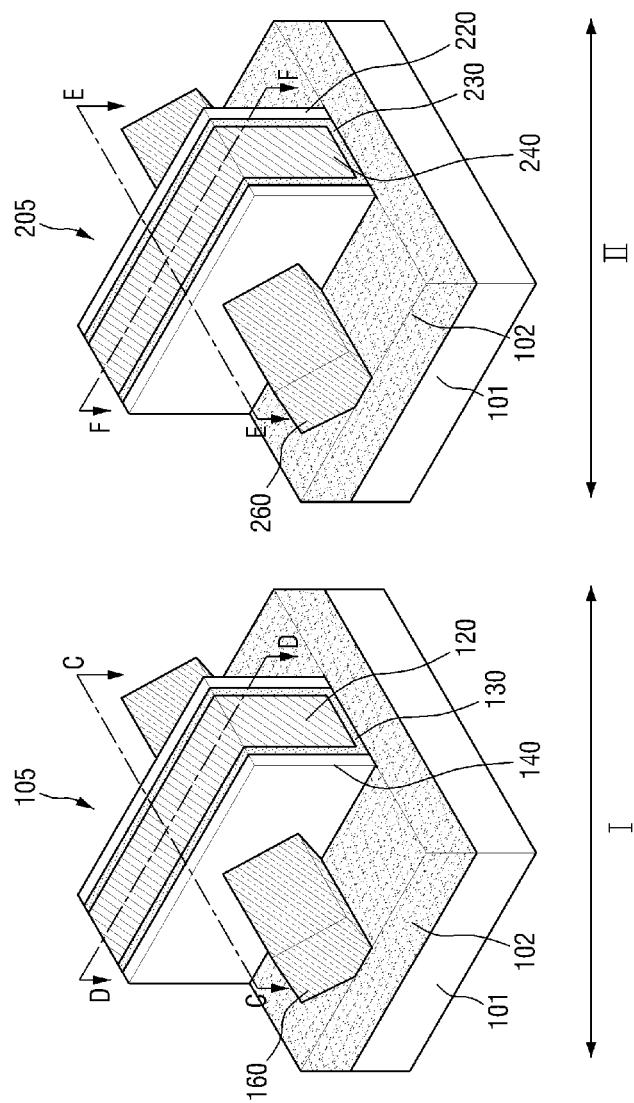
FIG. 25 is a perspective view of some examples of a semiconductor device according to the present inventive concept.
Figure 26:
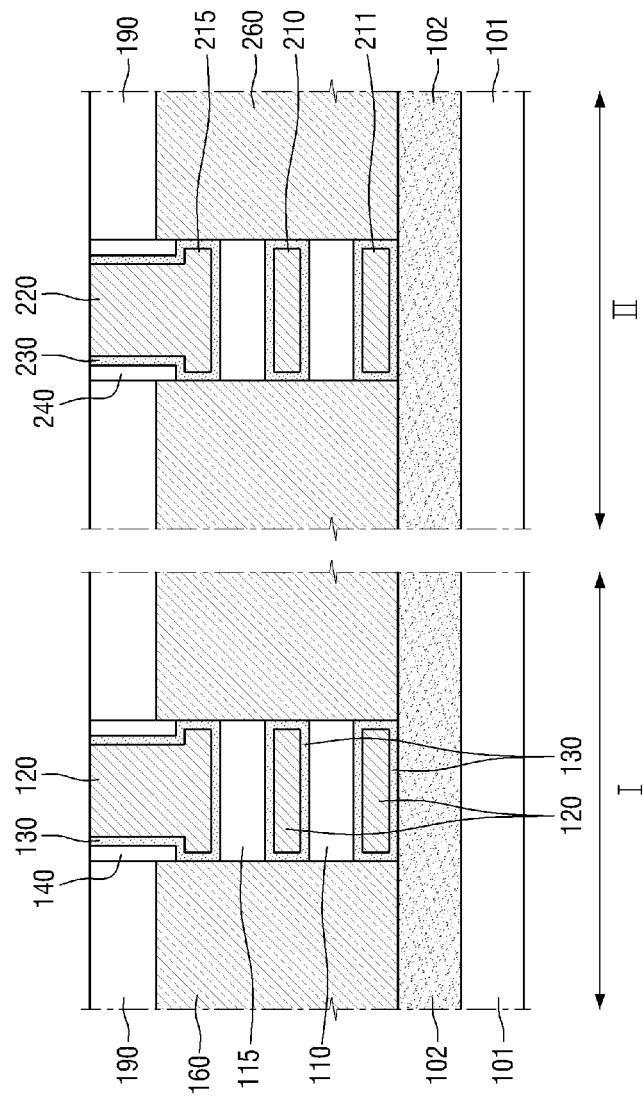
FIG. 26 is a cross-sectional view taken along each of line C-C and line E-E of FIG. 25.
Figure 27:
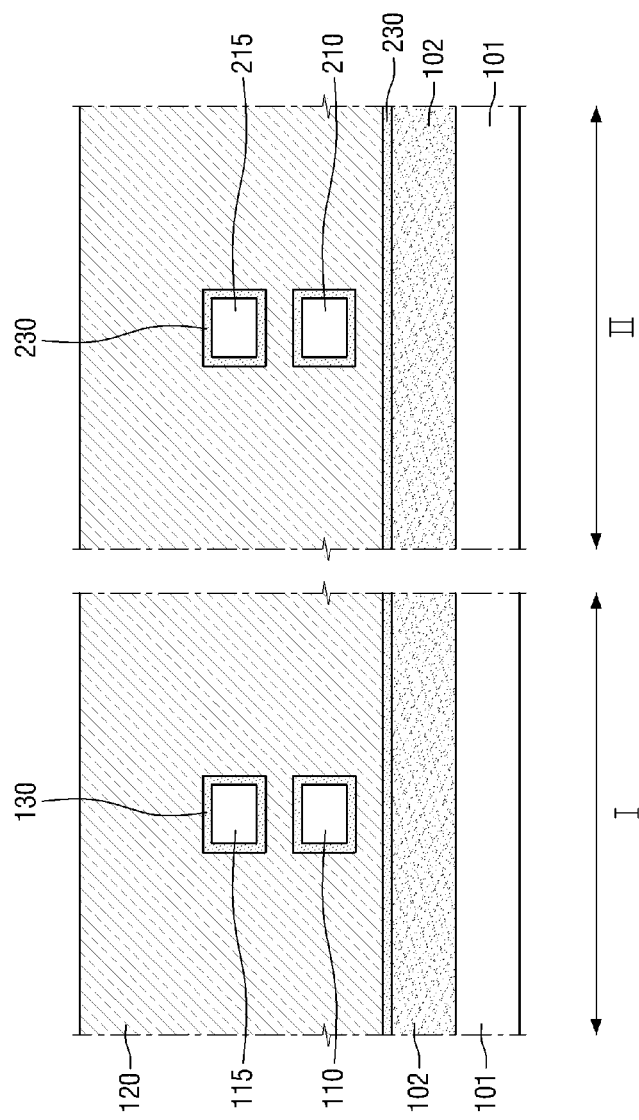
FIG. 27 is a cross-sectional view taken along each of line D-D and line F-F of FIG. 25.

Referring to FIGS. 25 through 27, a semiconductor device according to the present examples includes a first transistor 105 and a second transistor 205.

The first transistor 105 and the second transistor 205 may be formed on the buffer layer 102. The first transistor 105 may include a first wire pattern 110, a third wire pattern 115, a first gate electrode 120, a first gate insulating film 130, first gate spacers 140 and a first source/drain 160. The second transistor 205 may include a third wire pattern 210, a fourth wire pattern 215, a second gate electrode 220, a second gate insulating film 230, second gate spacers 240 and a second source/drain 260.

In the second transistor 205, each of the second gate electrode 220, the second gate insulating film 230, the second gate spacers 240 and the second source/drain 260 may be substantially the same as the first gate electrode 120, the first gate insulating film 130, the first gate spacers 140 and the first source/drain 160 of the first transistor 105.

In the present example, the substrate 101 may include a first region I and a second region II. The first region I and the second region II may be regions spaced apart from each other, and may be regions connected to each other. The second region II may be a logic region or a SRAM formation region, and the first region I may be, but is not limited to, a region (DRAM, MRAM, RRAM and PRAM) in which a memory different from the logic region is formed.

Furthermore, for example, the first region I may include a P-type transistor region, and the second region II may include an N-type transistor region. The first transistor 105 may be a P-type transistor, and the second transistor 205 may be an N-type transistor. Accordingly, the first transistor 105 is formed in the first region I, and the second transistor 205 is formed in the second region II. The present inventive concept is not limited to the above-described examples, and in an opposite case to the above-mentioned examples, for example, a first region I may also include an N-type transistor region, and the second region II may also include a P-type transistor region.

Next, an example will be described in which the first transistor 105 is a P-type transistor and the second transistor 205 is an N-type transistor.

As described above, the first transistor 105 includes the first and third wire patterns 110 and 115, and the second transistor 205 includes the second and fourth wire patterns 210 and 215. All of the first to fourth wire patterns 110, 115, 210 and 215 may include the compound semiconductor material, and for example, may include a group III-V compound semiconductor material.

However, the first and third wire patterns 110 and 115 may include a Sb series group III-V compound semiconductor material, and the second and fourth wire patterns 210 and 215 may include an As series group III-V compound semiconductor material.

In an example in which the first transistor 105 is a P-type transistor and the second transistor 205 is an N-type transistor, when the first and third wire patterns 110 and 115 include the Sb series III-V group compound semiconductor material and the second and fourth wire patterns 210 and 215 include the As series group III-V compound semiconductor material, the mobility of the channels of each transistor may be improved.

Figure 28:
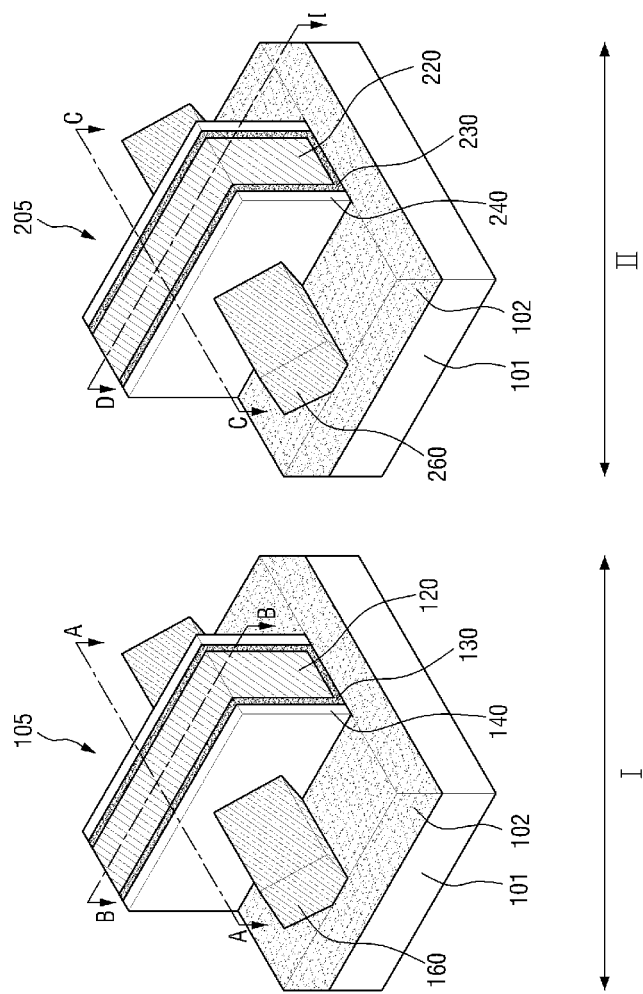
FIG. 28 is a perspective view of some examples of a semiconductor device according to the present Inventive concept.
Figure 29:
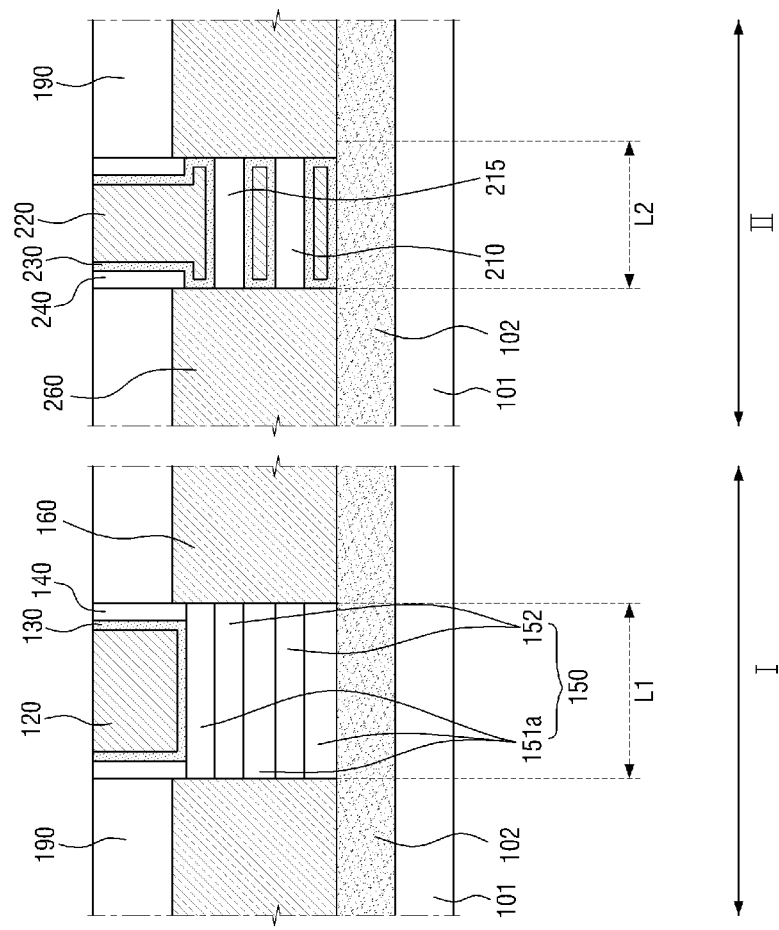
FIG. 29 is a cross-sectional view taken along each of lines A-A and C-C of FIG. 28.
Figure 30:
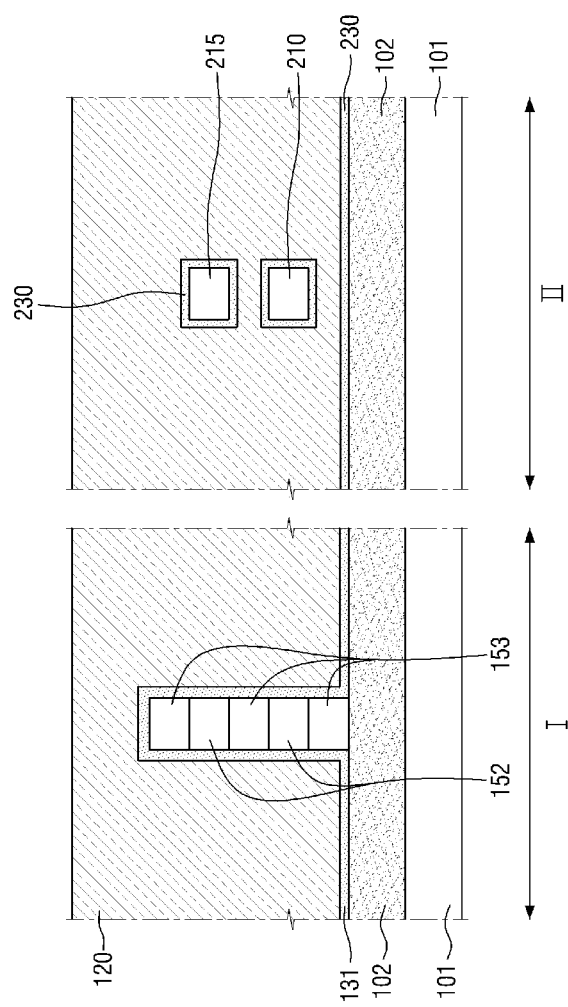
FIG. 30 is a cross-sectional view taken along each of lines B-B and D-D of FIG. 28.

Next, a semiconductor device according to some examples of the present Inventive concept will be illustrated referring to FIGS. 28 through 30.

The semiconductor device may include transistors disposed in different regions from each other. More specifically, the semiconductor device according to the present example may include the semiconductor device described reference to FIGS. 1 through 3 and the semiconductor device described through FIGS. 20 through 22. Therefore, only the differences between the examples will be mainly described.

Referring to FIGS. 28 through 30, a semiconductor device according to the present inventive concept may include a first transistor 105 and a second transistor 205 disposed on the substrate 101 and the buffer layer 102.

The first transistor 105 includes a first fin-type structure 150, a first gate electrode 120, a first gate insulating film 130, first gate spacers 140 and a first source/drain 160. The first fin-type structure 150 may include an oxide pattern 151a and a semiconductor pattern 152. The first transistor 105 may be substantially the same as the semiconductor device described with reference to FIGS. 1 through 3.

The second transistor 205 includes a first wire pattern 210, a third wire pattern 215, a first gate electrode 220, a first gate insulating film 230, first gate spacers 240 and a first source/drain 260.

Each of the first wire pattern 210, the third wire pattern 215, the first gate electrode 220, the first gate insulating film 230, the first gate spacers 240 and the first source/drain 260 of the second transistor 205 may be substantially the same as each of the first wire pattern 110, the third wire pattern 115, the first gate electrode 120, the first gate insulating film 130, the first gate spacers 140 and the first source/drain and 160 of the semiconductor device described with reference to FIGS. 20 through 22.

In the present example, the substrate 101 may include a first region I and a second region II. The first region I and the second region II may be regions spaced apart from each other and may also be regions connected to each other. The second region II may be a logic region or a SRAM formation region, and the first region I may be, but is not limited to, a region (DRAM, MRAM, RRAM and PRAM) in which a memory different from the logic region is formed. Accordingly, at least one region of the first region I and the second region II may be a logic region or a SRAM formation region.

In the present example, the semiconductor pattern 152 may be disposed at the same height as the first and second wire patterns 210 and 215 from the substrate 101. That is, each side surface of the two semiconductor patterns 152 may face the side surfaces of the first and second wire patterns 210 and 215.

Meanwhile, in the present example, a length L1 of the fin-type structure 150 may be greater than a length L2 of the first wire pattern 210.

Furthermore, in the present example, the length L1 may correspond to a separation distance between the source and drain regions of the first source/drain 160. Meanwhile, the length L2 may correspond to a separation distance between the source and drain regions of the first source/drain 260.

The first transistor 105 disposed in a first region I provides a longer channel than the second transistor 205 disposed in the second region II because the nanowire channel of the second transistor 205 is relatively short. Accordingly, it is possible to effectively suppress a short channel effect (SCE), and because the channel provided by the fin structure of the transistor in the semiconductor device is relatively long, it is possible to improve the reliability of the semiconductor device.

In some examples of the present inventive concept, the transistor having a relatively short channel may be a transistor formed in the logic region and the SRAM formation region.

Next, still other examples of a semiconductor device according to the present inventive concept will be described with reference to FIGS. 31 through 33.

These examples of a semiconductor device include the semiconductor device described with reference to FIGS. 1 through 3, and the semiconductor device described with reference to FIGS. 26 and 27. Therefore, mainly only the differences between the present examples and those of FIGS. 1 through 3 and FIGS. 26 and 27 will be described.

Figure 31:
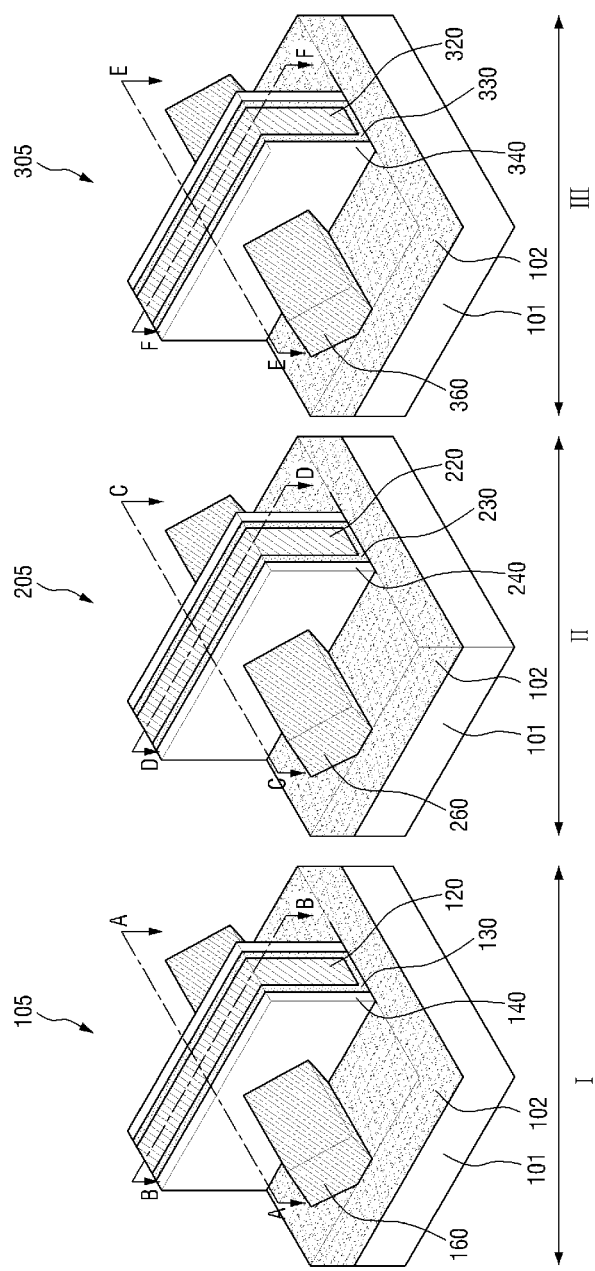
FIG. 31 is a perspective view of some examples of a semiconductor device according to the present inventive concept.
Figure 32:
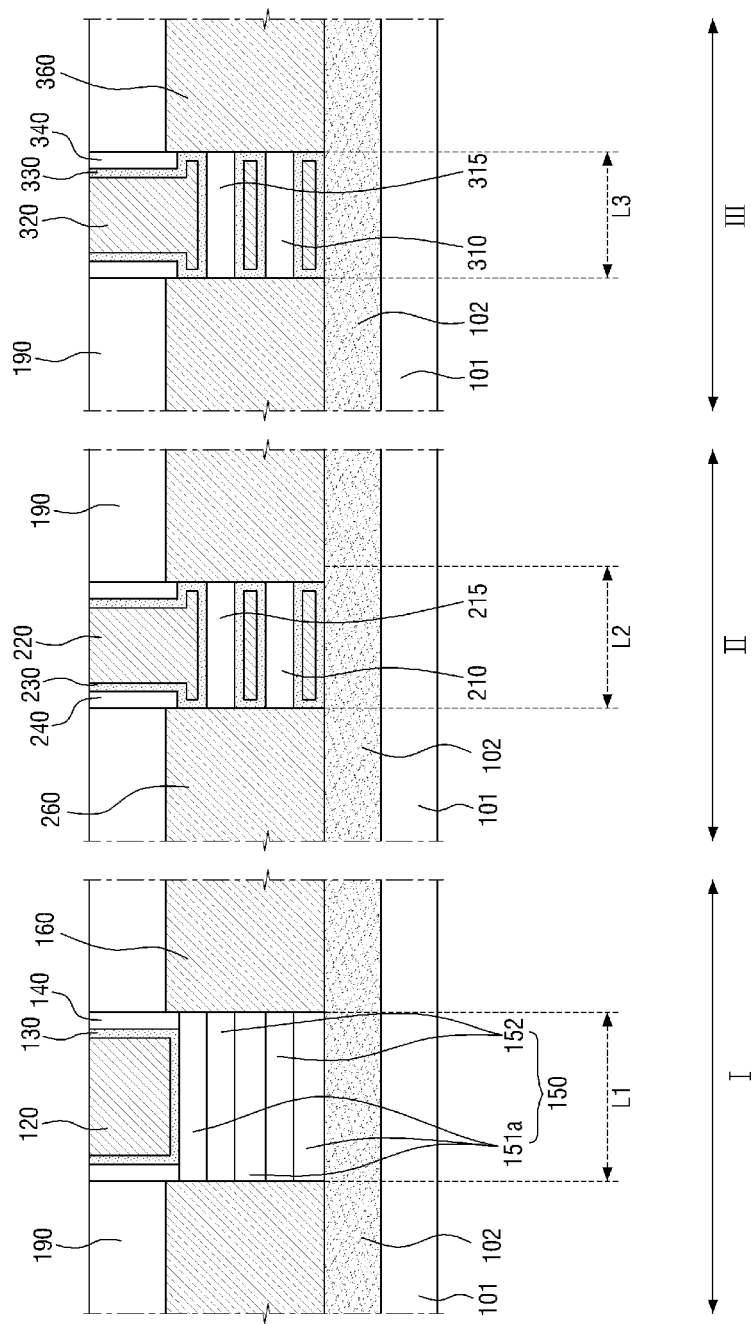
FIG. 32 is a cross-sectional view taken along each of lines A-A, C-C and E-E of FIG. 31.
Figure 33:
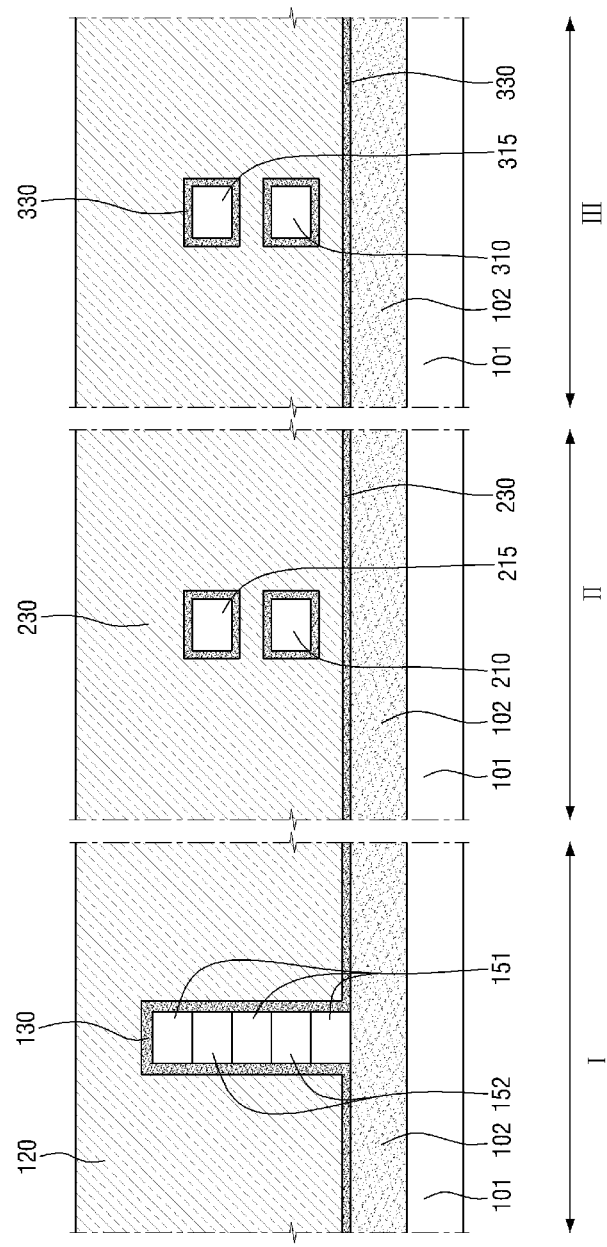
FIG. 33 is a cross-sectional view taken along each of lines B-B, D-D and F-F of FIG. 31.

Referring to FIGS. 31 to 33, the first transistor 105 is formed in the first region I, the second transistor 205 is formed in the second region II, and a third transistor 305 is formed in the third region III.

The first transistor 105 is substantially the same as the semiconductor device described with reference to FIGS. 1 through 3, and the second transistor 205 and the third transistor 305 are substantially the same as the first transistor 105 and the second transistor 205 described with reference to FIGS. 26 through 27. That is, the second transistor 205 of the present example may be substantially the same as the first transistor 105 of FIG. 26, and the third transistor 305 of the present example may be substantially the same as the second transistor 205 of FIG. 26.

In the present example, the second region II and the third region III may be a logic region or a SRAM formation region. Furthermore, although the second region II may be a logic P-type transistor region, and the third region III may be a logic N-type transistor region, the inventive concept is not limited thereto.

Because the second transistor 205 may be a P-type transistor, the first wire pattern 210 and the third wire pattern 215 of the second transistor 205, for example, may include a material with high hole mobility of a positive hole. Accordingly, the first wire pattern 210 and the third wire pattern 215 may contain an Sb series group III-V compound semiconductor.

Because the third transistor 305 may be an N-type transistor, the second wire pattern 310 and the fourth wire pattern 315 of the third transistor 305, for example, may include a material with high mobility of electrons. Therefore, the second wire pattern 310 and the fourth wire pattern 315 may include an As series group III-V compound semiconductor.

In the present example, the fin-type structure 150 of the first transistor 105 extends in a first direction, and the first gate electrode 120 may extend in a second direction different from the first direction. The fin-type structure 150 may have a length L1 in the first direction.

The first wire pattern 210 and the third wire pattern 215 of the second transistor 205 may extend in a first direction, and the second gate electrode 220 may extend in second direction different from the first direction. The first wire pattern 210 and the third wire pattern 215 may have a length L2 in the first direction.

Furthermore, the second wire pattern 310 and the fourth wire pattern 315 of the third transistor 305 may extend in a first direction, and the third gate electrode 320 may extend in a second direction different from the first direction. The second wire pattern 310 and the fourth wire pattern 315 may have a length L3 in the first direction.

The lengths L1, L2 and L3 may correspond to widths of the transistors 105, 205 and 305, respectively.

The width (length L3) of the third transistor 305 may be less than the width (length L1) of the first transistor 105. The width (length L3) of the third transistor may be the same as the width (length L2) of the second transistor 205. Thus, the width (length L3) of the third transistor 305 is less than the (length L1) of the first transistor 105 but may be greater or less than the (length L2) of the second transistor 205.

In the present example, the second transistor 205 and the third transistor 305 include a nano-wire channel. Therefore, the device reliability may be improved in the case of having a channel length shorter than the first transistor 105.

Figure 34:
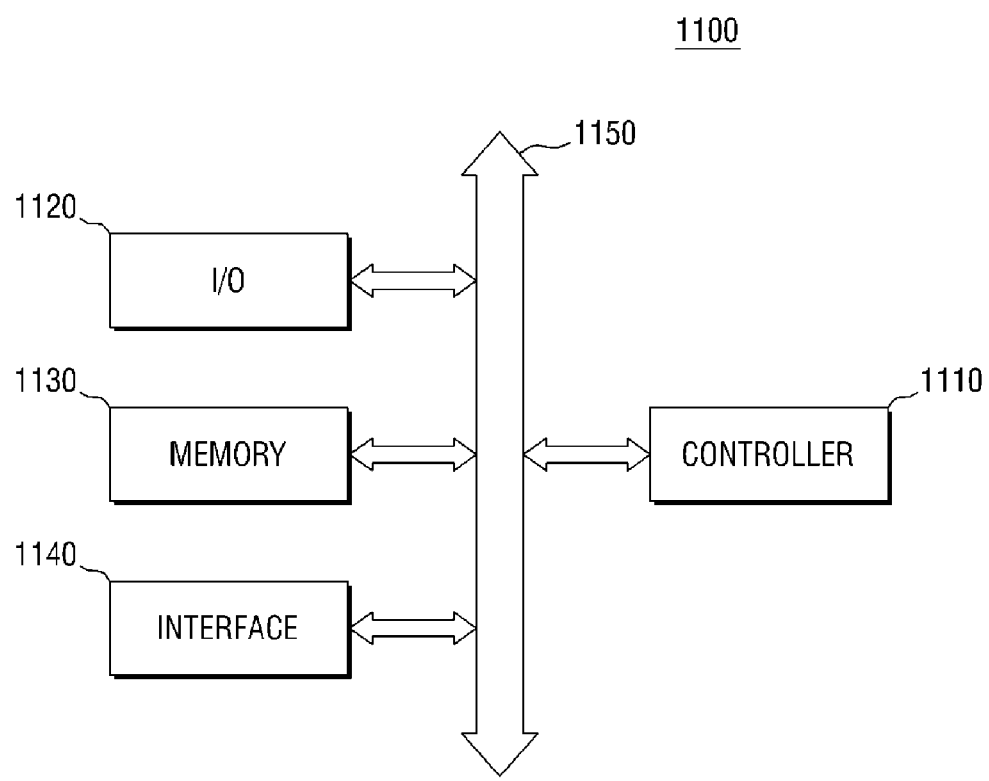
FIG. 34 is a block diagram of an electronic system including a semiconductor device according to the present inventive concept.

FIG. 34 is a block diagram of examples of an electronic system which may include a semiconductor device according to the present inventive concept.

Referring to FIG. 34, an electronic system 11000 according to an example of the present inventive concept may include a controller 11100, an input/output (I/O) device 11200, a memory device 11300, an interface 11400 and a bus 11500. The controller 11100, the I/O device 11200, the memory device 11300 and/or the interface 11400 may be connected to one another through a bus 11500. The bus 11500 corresponds to a path through which the data are moved.

The controller 11100 may include at least one of a microprocessor, a digital signal processor, a microcontroller and logic devices capable of performing functions similar to these devices. The I/O device 11200 may include a keypad, a keyboard, a display device and the like. The memory device 11300 may store data and/or commands. The interface 11400 may perform functions of transmitting data to or receiving data from a communication network. The interface 11400 may be a wired or wireless interface. For example, the interface 11400 may include an antenna or a wired or wireless transceiver. Although it is not illustrated, the electronic system 11000 may also include a high-speed DRAM and/or SRAM, as an operating memory for improving the operation of the controller 11100. A semiconductor device according to the present inventive concept may be provided in the memory device 11300 or may be provided as a part of the controller 11100, the input/output (I/O) 11200 or the like.

The electronic system 11000 may be applied to a personal digital assistant (PDA), a portable computer, a web tablet, a wireless phone, a smart phone, a mobile phone, a digital music player, a memory card or all types of electronic products capable of transmitting or receiving information in a wireless environment.

Figure 35:
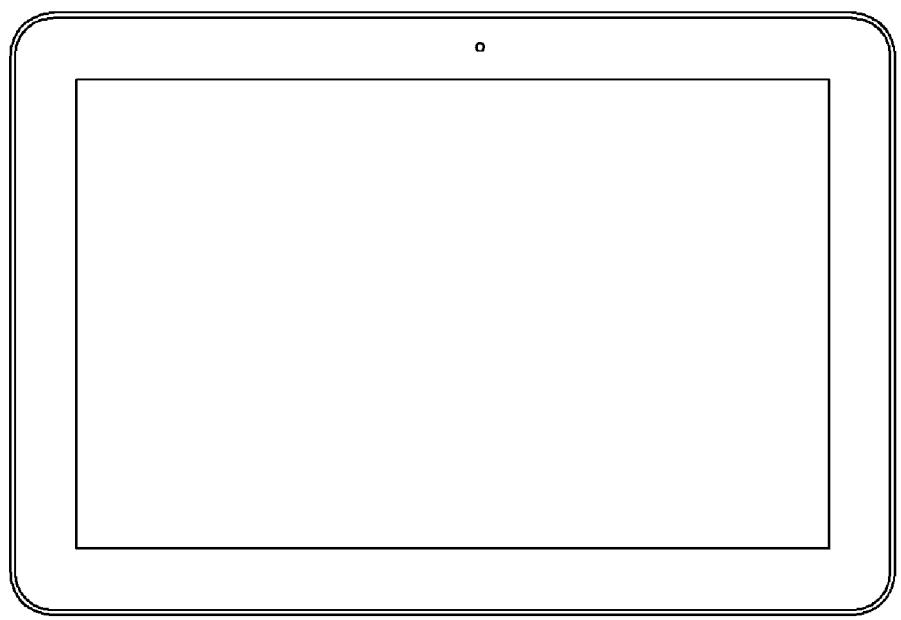
FIG. 35 is a front view of an example of an electronic product to which a semiconductor device according to the present inventive concept can be applied.

FIG. 35 is a diagram illustrating an example of an electronic product which may employ a semiconductor device according to the present inventive concept can be applied. More specifically, FIG. 35 illustrates a tablet PC. The semiconductor device in accordance with the present inventive concept may be used in a tablet PC, a notebook computer or the like. It is obvious to a person skilled in the art that the semiconductor device in accordance with the present inventive concept may also be applied to other IC devices other than those set forth herein.

Although the present inventive concept has been particularly illustrated and described with reference to several examples thereof, it will be understood by those of ordinary skill in the art that various changes in form and detail may be made to such examples without departing from the spirit and scope of the present inventive concept as defined by the following claims. Thus, the examples should be considered in a descriptive sense only and not in a limiting sense.

What is claimed is:

1. A semiconductor device comprising:
a substrate;
a fin-type structure that includes a laminate of at least three patterns of oxide and at least two patterns of semiconductor material disposed one on another on a first region of the substrate; and
a first gate electrode that extends longitudinally across the fin-type structure as passing over an uppermost pattern of the laminate of the fin-type structure,
wherein the patterns of oxide are alternately disposed with the patterns of semiconductor material in the laminate such that each of the patterns of semiconductor material is interposed between two of the patterns of oxide in the laminate,
one of the patterns of oxide is a lowermost pattern of the laminate and another of the patterns of oxide is said uppermost pattern of the laminate, and
the oxide comprises an oxidized compound including a plurality of elements and oxygen.

2. The semiconductor device of claim 1, further comprising:
a buffer layer interposed between the substrate and the fin-type structure, the buffer layer comprising a compound semiconductor.

3. The semiconductor device of claim 2, wherein a lattice constant of the buffer layer increases in a direction toward the fin-type structure from the substrate.

4. The semiconductor device of claim 1, wherein the patterns of oxide and semiconductor material of the laminate each comprises a group III-V compound semiconductor.

5. The semiconductor device of claim 1, wherein one of the elements of the oxidized compound is aluminum.

6. The semiconductor device of claim 1, wherein the substrate comprises silicon.

7. The semiconductor device of claim 1, further comprising a wire pattern structure and a second gate electrode on a second region of the substrate,
wherein the second gate electrode wraps around the wire pattern structure and extends longitudinally across the wire pattern structure.

8. The semiconductor device of claim 7, wherein the first gate electrode has a width, taken at a portion thereof lying over the fin-type structure, greater than a width of the second gate electrode taken at a portion thereof lying over the wire pattern structure.

9. The semiconductor device of claim 7, wherein the wire pattern structure includes a wire pattern disposed at the same height from the substrate as a pattern of the semiconductor material of the laminate.

10. The semiconductor device of claim 9, wherein the pattern of the semiconductor material of the laminate and the wire pattern of the wire pattern structure comprise a group III-V compound semiconductor of the same series.

11. A semiconductor device comprising:
a substrate having a first region, a second region and a third region;
a fin-type structure disposed on the first region of the substrate and extending longitudinally in a first direction;
a first gate electrode disposed on and extending longitudinally across the fin-type structure in a second direction different from the first direction;
a first wire pattern structure disposed on the second region of the substrate;
a second gate electrode wrapped around the first wire pattern structure and extending longitudinally across the first wire pattern structure;
a second wire pattern structure disposed on the third region of the substrate; and
a third gate electrode wrapped around the second wire pattern structure and extending longitudinally across the second wire pattern structure,
wherein the first wire pattern structure comprises an antimony (Sb) series group III-V compound semiconductor material,
the second wire pattern structure comprises an arsenic (As) series group III-V compound semiconductor,
the fin-type structure has a length corresponding to a channel length of a first transistor constituted by the first gate electrode,
the first wire pattern structure has a length corresponding to a channel length of a transistor constituted by the second gate electrode,
the second wire pattern structure has a length corresponding to a channel length of a third transistor constituted by the third gate electrode, and
the length of the second wire pattern structure is less than the length of the fin type structure.

12. The semiconductor device of claim 11, wherein the fin-type structure comprises a laminate of an oxide pattern and a semiconductor pattern disposed one on another, and the oxide pattern is an oxide of an aluminum series group III-V compound semiconductor.

13. The semiconductor device of claim 12, further comprising:
a buffer layer interposed between the substrate and the fin-type structure, between the substrate and the second gate electrode, and between the substrate and the third gate electrode, and
the buffer layer comprises a group III-V compound semiconductor.

14. The semiconductor device of claim 13, wherein a lattice constant of the buffer layer increased in a direction toward the fin-type structure from the substrate.

15. The semiconductor device of claim 11, wherein the substrate comprises silicon.

16. A semiconductor device comprising:
a substrate;
a raised channel-forming structure extending upright on the substrate and having an upper surface, opposite first sides and opposite second sides;
a gate electrode that extends over the upper surface of the channel-forming structure and the opposite first sides of the channel-forming structure, a central part of the gate electrode in a direction of width of the gate electrode being disposed along a vertical axis; and
a source/drain region adjacent to the opposite second sides of the channel-forming structure,
wherein the channel-forming structure includes a plurality of vertically spaced-apart channel-forming patterns each of a group III-V compound semiconductor and first, second and third oxide patterns interposed along the vertical axis between the gate electrode and the substrate,
the first oxide pattern is interposed along the vertical axis between a lowermost one of the channel-forming patterns and the substrate, the second oxide pattern is interposed along the vertical axis between respective ones of the channel-forming patterns, and the third oxide pattern is interposed along the vertical axis between an uppermost one of the channel-forming patterns and the central part of the gate electrode, and
the first, second and third oxide patterns comprise an oxidized compound containing a plurality of elements plus oxygen.

17. The semiconductor device of claim 16, wherein the oxidized compound has a lattice constant between that of the substrate and the channel-forming patterns.

18. The semiconductor device of claim 16, further comprising a buffer interposed between the substrate and the raised channel-forming structure and between the substrate and the source/drain region, the buffer having a lattice constant between that of the substrate and the channel-forming patterns.

19. The semiconductor device of claim 16, wherein the channel-forming patterns are in the shape of wires extending longitudinally from one of the second opposite sides of the channel-forming structure to the other of the second opposite sides of the channel-forming structure, and
the gate electrode wraps around the channel-forming patterns.

20. The semiconductor device of claim 1, comprising source and drain regions on opposite sides of the laminate, wherein the first gate electrode extends longitudinally over the substrate beyond the source and drain regions.

* * * * *